US008106805B2

(12) United States Patent
Lin

(10) Patent No.: US 8,106,805 B2
(45) Date of Patent: Jan. 31, 2012

(54) SELF-CALIBRATING PIPELINE ADC AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 124 days.

(21) Appl. No.: 12/637,924

(22) Filed: Dec. 15, 2009

(65) Prior Publication Data
US 2010/0225513 A1    Sep. 9, 2010

Related U.S. Application Data

(60) Provisional application No. 61/157,898, filed on Mar. 5, 2009.

(51) Int. Cl.
*H03M 1/12* (2006.01)
(52) U.S. Cl. ......... 341/156; 341/155; 341/120; 341/161
(58) Field of Classification Search ................... 341/156, 341/155, 120, 161
See application file for complete search history.

(56) References Cited

U.S. PATENT DOCUMENTS

| 5,274,377 | A  | * | 12/1993 | Matsuura et al. | ............. | 341/161 |
| 6,323,800 | B1 | * | 11/2001 | Chiang | ......................... | 341/161 |
| 7,042,383 | B2 | * | 5/2006 | Mishra et al. | ................. | 341/156 |
| 7,148,832 | B2 | * | 12/2006 | Wada et al. | .................... | 341/155 |
| 2005/0110669 | A1 | * | 5/2005 | Mishra et al. | ................. | 341/156 |
| 2007/0285298 | A1 | * | 12/2007 | Easwaran et al. | ............. | 341/155 |
| 2007/0290914 | A1 | * | 12/2007 | Matsushita et al. | ........... | 341/155 |
| 2008/0068237 | A1 | * | 3/2008 | Jeon et al. | ...................... | 341/122 |
| 2008/0198055 | A1 | * | 8/2008 | Matsubayashi | ............... | 341/155 |
| 2009/0096647 | A1 | * | 4/2009 | Nazemi | ......................... | 341/122 |

* cited by examiner

*Primary Examiner* — Jean Jeanglaude
(74) *Attorney, Agent, or Firm* — Thomas, Kayden, Hostemeyer & Risley, LLP

(57) ABSTRACT

An inter-stage gain of a conversion stage of a pipeline ADC is calibrated by imposing a perturbation to a sub-ADC within the conversion stage and adjusting a gain factor in a closed loop manner so as to make a conversion output substantially independent of the perturbation.

18 Claims, 2 Drawing Sheets

SELF-CALIBRATING PIPELINE ADC AND METHOD THEREOF

CROSS REFERENCE TO RELATED APPLICATIONS

This application claims the benefit of U.S. Provisional Application No. 61/157,898, filed on Mar. 5, 2009, entitled "SELF-CALIBRATING PIPELINE ADC AND METHOD THEREOF" which is incorporated herein by reference.

FIELD OF TECHNOLOGY

This disclosure relates generally to pipeline ADC (analog-digital converter), and in particular to methods and apparatus of automatically calibrating a pipeline ADC.

BACKGROUND

A pipeline ADC (analog-digital converter) comprises a plurality of conversion stages, including at least a first stage and a last stage. Except the last stage, each conversion stage has a succeeding stage. Except the first stage, each conversion stage has a preceding stage. Each conversion stage, except the last stage, performs the following functions: receiving an analog input signal; performing a coarse analog-to-digital conversion on the analog input signal to generate an intermediate digital code; generating a residual signal that represents the difference between the analog input signal and a signal level corresponding to the intermediate digital code; amplifying the residual signal by a inter-stage gain factor to generates an analog output signal, which is passed to a succeeding stage as the analog input signal for the succeeding stage; receiving a digital input code from its succeeding stage; and combining the digital input code with the intermediate digital code into a digital output code, which is passed to its preceding stage (if applicable) as the digital input code for the preceding stage. The last stage receives an analog input signal from its preceding stage and performs a coarse analog-to-digital conversion on the analog input signal to generate a digital output code, which is passed to its preceding stage as the digital input code for the preceding stage. For each conversion stage except the last stage, the digital input code received from its succeeding stage presents a result of an analog-to-digital conversion on the analog output signal that it passes to its succeeding stage. Note that when generating the analog output signal, amplification of an inter-stage gain factor has been introduced so as to efficiently utilize the dynamic range of the succeeding stage. Therefore, when combining the digital input code with the intermediate digital code to generate the digital output code, the inter-stage gain factor that is involved in generating the analog output signal and passing it to the succeeding stage needs to be taken into account. For instance, a conversion stage that performs a 1-bit analog-to-digital conversion has a nominal inter-stage gain factor of two. So, when combining the digital input code with the intermediate digital code into the digital output code, the intermediate digital code needs to be scaled by a factor of two, or alternatively the digital input code needs to be scaled by a factor of one half, to account for the effect of the inter-stage gain. If somehow the actual inter-stage gain factor deviates from the nominal inter-stage gain factor, an error occurs due to the mismatch between the actual inter-stage gain factor used in the amplification and the assumed inter-stage gain factor used in combining the digital input code with the intermediate digital code. In many pipeline ADCs, the deviation from the nominal inter-stage gain factor is a major source of error. What is needed is an efficient method for correcting the error due to the deviation from the assumed inter-stage gain factor.

DETAILED DESCRIPTION

Figure 1:
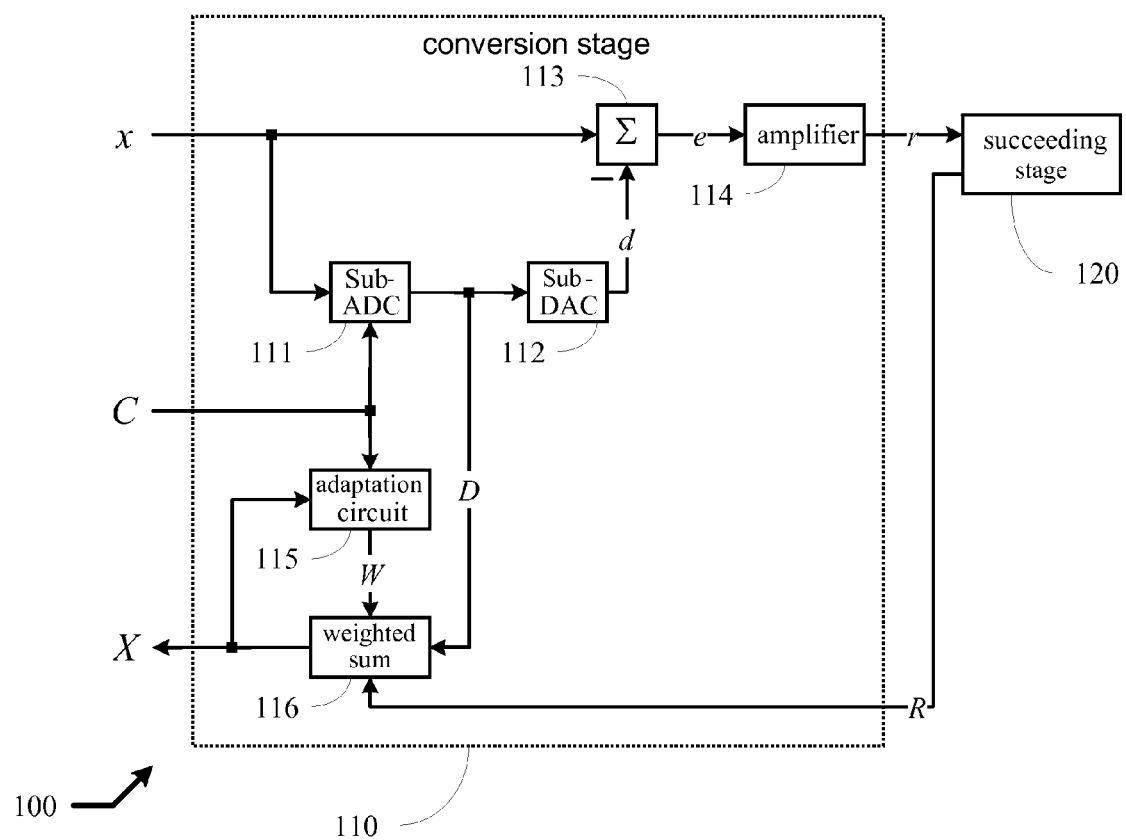
FIG. 1 shows an ADC in accordance with various embodiments of the invention.

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

In various embodiments, a pipeline ADC (analog-digital converter) is disclosed, the pipeline ADC comprises a first conversion stage and a second conversion stage. The first conversion stage receives a first analog signal, a first digital code, a control code, and generates a second analog signal, and a second digital code; the second conversion stage receives the second analog signal and generates the first digital code. The first conversion stage further comprises: a sub-ADC that converts the first analog signal into an intermediate digital code under a perturbation by the control code; a sub-DAC (digital-analog converter) that converts the intermediate digital code into an intermediate analog signal; an analog summing circuit that subtracts the intermediate analog signal from the first analog signal to generate a residual analog signal; an amplifier that amplifies the residual analog signal by an inter-stage gain factor to generate the second analog signal; and a digital summing circuit that generates the second digital code by performing a weighted sum on the intermediate digital code and the first digital code in accordance with a weighting factor. The first conversion stage further comprises an adaptation circuit that receives the second digital code and the control code and generates the weighting factor in accordance with a correlation between the second digital code and the control code.

In various embodiments, a method of performing analog-to-digital conversion is disclosed, the method comprising: receiving a first analog signal; receiving a first digital code; receiving a control code; converting the first analog signal into an intermediate digital code in accordance with the control code; converting the intermediate digital code into an intermediate analog signal; generating a residual analog signal by subtracting the intermediate analog signal from the first analog signal; generating a second analog signal by amplifying the residual analog signal with a gain factor; transmitting the second analog signal to an analog-to-digital converter, which receives and converts the second analog signal into a first digital code; receiving the first digital code from the analog-to-digital converter; performing a weighted sum on the intermediate code and the first digital code in accordance with a weighting factor to generate a second digital code; and adapting the weighting factor in accordance with a correlation between the second digital code and the control code.

In an embodiment, a functional block diagram of a pipeline ADC (analog-digital converter) 100 is depicted in FIG. 1. Pipeline ADC 100 comprises a conversion stage 110 and a succeeding stage 120. The conversion stage 110 receives a first analog signal x from a preceding circuit (not shown in figure), a first digital code R from the succeeding stage 120, and a control code C, and generates a second analog signal r and a second digital code X; the succeeding stage 120 receives the second analog signal r and converts it into the first digital code R. The conversion stage 110 further comprises: a sub-ADC 111 that converts the first analog signal x into an intermediate digital code D in accordance with a control under the control code C; a sub-DAC 112 that converts the intermediate digital code D into an intermediate analog signal d; an analog summing circuit 113 that subtracts the intermediate analog signal d from the first analog signal x to generate a residual analog signal e; an amplifier 114 that amplifies the residual analog signal e by an inter-stage gain factor G to generate the second analog signal r; and a digital weighted sum circuit 116 that generates the second digital code X by performing a weighted sum on the intermediate digital code D and the first digital code R in accordance with a weighting factor W. The conversion stage 110 further comprises an adaptation circuit 115 that receives the second digital code X and the control code C to generate the weighting factor W in accordance with a correlation between the control code C and the second digital code X.

This present invention can be understood using the following mathematical model. Sub-ADC 111 can be modeled as adding to the first analog input x a quantization error $q(C)$ that is dependent on the control code C; that is, $$D=x+q(C), \quad (1)$$

where $q(C)$ is a quantization error that is C dependent. Sub-DAC 112 can be modeled as a unity-gain device; that is, $D=d$. Analog summing circuit 113 performs a summing function:

$$e=x-d=x-D=-q(C). \quad (2)$$

Amplifier 114 performs a multiplication function; i.e. $r=G \cdot e = -G \cdot q(C)$.

Succeeding stage 120 converts r into R and can also be modeled as adding to r a quantization noise; that is, $R=r+n$, where n is a quantization error. In an embodiment, digital weighted sum circuit 116 performs the following weighted-sum function:

$$X=D+W \cdot R=D+W \cdot (r+n)=D-W \cdot G \cdot q(C)+W \cdot n. \quad (3)$$

Combining equations (1) and (3), one obtains $$X=x+(1-W \cdot G) \cdot q(C)+W \cdot n. \quad (4)$$

Note that in practical implementation, there is latency for the intermediate digital code D to traverse through sub-DAC 112, analog summing circuit 113, amplifier 114, and the succeeding stage 120 to result into the first digital code R. Therefore, when performing the weighted-sum function, care must be taken to insert a certain delay to the intermediate code D before summing it with W·R to make sure the delayed version of D is synchronized in time with W·R, otherwise the weighted-sum is faulty.

The purpose of the adaptation circuit 115 is to adjust the weighting factor W in a closed loop manner so as to reach the condition W·G=1. When the condition W·G=1 is reached, equation (4) leads to:

$$X=x+W \cdot n, \quad (5)$$

which indicates that the second digital code X is the same as the first analog signal x, except for an error term W·n, which is an additive noise (introduced by the succeeding stage 120 due to its finite precision in analog-to-digital conversion) that is independent of the first analog signal x and the control code C. When the condition W·R=1 does not hold, there is a correlation between the second digital code X and the control code C, as evidently seen in equation (4). The adaptation circuit 115 adjusts the weighing factor W so as to minimize the correlation between the control code C and the second digital code X. The algorithm used for adjusting the weighing factor W is disclosed as follows.

Figure 2:
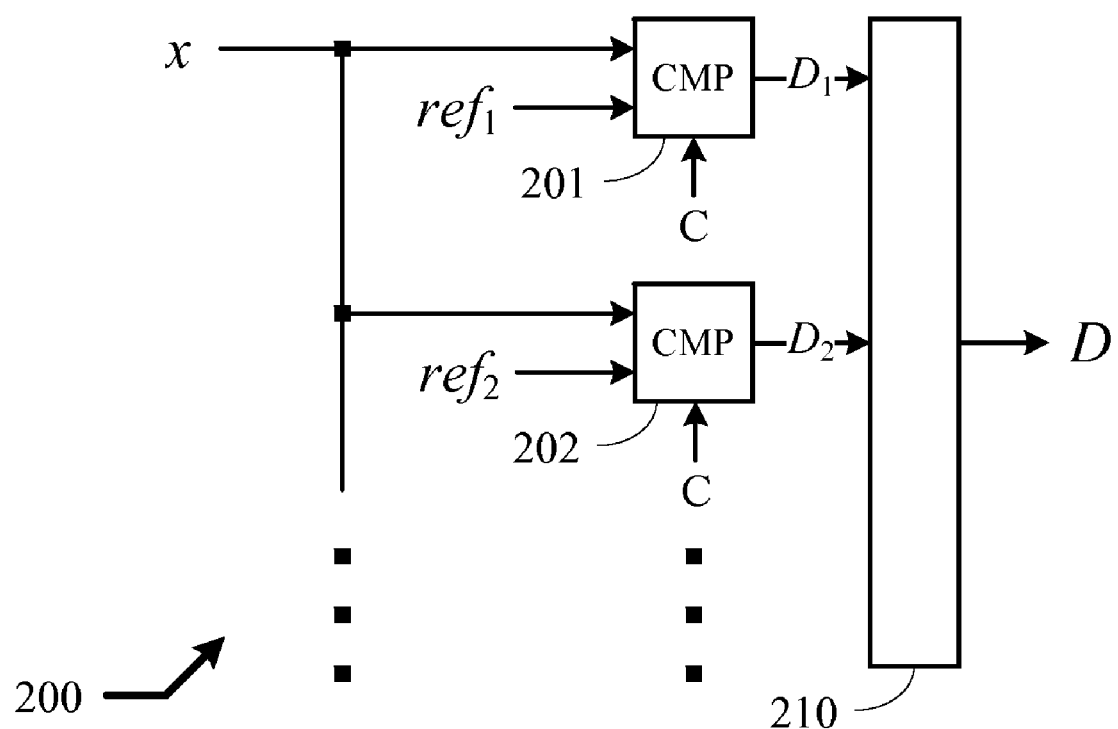
FIG. 2 shows a sub-ADC for the ADC of FIG. 1 in accordance with various embodiments of the invention.

An ADC 200 suitable for implementing sub-ADC 111 of FIG. 1 is illustrated in FIG. 2. ADC 200 comprises a plurality of comparators (201, 202, and so on) and a summing circuit 210. Each comparator compares the first analog signal x with a reference level ($ref_1$, $ref_2$, and so on) and outputting a binary decision ($D_1$, $D_2$, and so on) of either 1 (when x is higher than the respective reference level) or 0 (when x is not higher than the respective reference level). The summing circuit 210 sums up the binary decisions ($D_1$, $D_2$, and so on) from all comparators (201, 202, and so on) to form the intermediate digital code D. Each comparator is further controlled by the control code C. In an embodiment, the control code C is a binary sequence that is either 1 or −1. When C is 1 (−1), a positive (negative) offset is introduced to the respective reference levels for all comparators and as a result the digital code D tends to be lower (higher) in a statistical sense; therefore, the term $q(C)$ also tends to be lower (higher), as evidently seen in equation (1). Also as evidently shown in equation (4): if $(1-W \cdot G)>0$, then X will tend to be lower (higher) when $q(C)$ tends to be lower (higher); on the other hand, if $(1-W \cdot G)<0$, X will tend to be higher (lower) when $q(C)$ tends to be lower (higher). Therefore, if C is 1 (−1) and X tends to be lower (higher), it indicates that $(1-W \cdot G)>0$ and thus the weighting factor W is too small and needs to be increased. On the other hand, if C is 1 (−1) and X tends to be higher (lower), it indicates that $(1-W \cdot G)<0$ and thus the weighting factor W is too large and needs to be decreased. In an embodiment, the control code C is a pseudo-random binary sequence that is substantially equally likely to be 1 or −1. In an alternative embodiment, the control code C is a binary sequence alternating between 1 and −1. In a general embodiment where C is substantially equally likely to be 1 or −1, the weighting factor is adjusted according to the following equation:

$$W^{(new)}=W^{(old)}-\mu \cdot X \cdot C. \quad (6)$$

Here, $\mu$ is an adaptation gradient. When $\mu$ is smaller, the adaptation is slower but less noisy and more likely to be convergent. When $\mu$ is larger, the adaptation is faster but noisier and more likely to be divergent. In an exemplary embodiment: a 11-bit analog-to-digital conversion is sought for a pipeline ADC 100 where the first analog signal x is normalized to the interval [−1, 1]; the sub-ADC 111 is a 1.5-bit ADC (where the intermediate digital code D is one of 0, 1, and 2, weighted by a normalization factor of $2^{-1}$ for the least-significant bit) with two nominal reference levels −0.25 and 0.25 used for two comparators within the sub-ADC 111; when the control code C is 1 (−1), the two reference levels are offset by 0.2 (−0.2); the nominal inter-stage gain G is 2; the initial and nominal weighting factor W is $2^{-1}$; and the succeeding stage 120 is a 10-bit ADC (where the first digital code R is one of 0, 1, 2, ..., and 1023, weighted by a normalization factor of $2^{-10}$ for the least-significant bit); and the value for $\mu$ is between $2^{-16}$ and $2^{-13}$, depending on a tradeoff between convergence speed and adaptation noise. In an embodiment seeking to reduce the adaptation noise, adaptation is performed only when X is within the neighborhood of a region where the perturbation due to the control code C is possibly relevant. For instance, C is possibly relevant only when X is near the two nominal reference levels (0.25 and −0.25) used by the sub-ADC 111.

In an embodiment, the adaptation of the weighting factor W is performed continually. This ensures the inter-stage gain error is tracked and corrected all the time. In an embodiment, the adaptation of the weighting factor W is performed only intermittently. In an embodiment, the adaptation of the weighting factor W is performed upon system start-up where there is no meaningful analog input signal to process; in this case, the first analog signal is replaced by a fixed level (for example, 0.25 or −0.25 for the above mentioned embodiment).

Embodiments of sub-DAC 112, analog summing circuit 113, and amplifier 114 are all well known in prior art and thus not described in detail here. In a preferred embodiment, these functional blocks are all implemented by switch-capacitor circuits.

Succeeding stage 120 performs an analog-to-digital conversion. From a viewpoint of the conversion stage 110, the succeeding stage 120 is a functional block that takes in the second analog signal r and gives out the first digital code R that represents an analog-to-digital conversion of the analog signal r, and the detailed implementation of the succeeding stage 120 is irrelevant as long as its analog-to-digital conversion function is fulfilled and the latency involved is known. In an embodiment, the succeeding stage 120 is also a convergence stage that is similar to the conversion stage 110. In this case, the succeeding stage 120 has yet its own succeeding stage. In an embodiment, a pipeline ADC comprises a plurality of front-end stages and a backend stage, wherein all the front-end stages are functionally similar to the conversion stage 110. In this case, adaptation for the weighting factor W for each conversion stage starts from the last front-end stage and gradually extends to the earlier stages. For instance, if there are 4 front-end stages, adaptation starts from the $4^{th}$ stage; after the adaptation converges for the $4^{th}$ stage, the $3^{rd}$ stage starts its adaptation for its weighting factor; after the adaptation convergence for the $3^{rd}$ stage, the $2^{nd}$ stage starts its adaptation for its weighting factor; and so on. In an embodiment, the condition of "convergence" is reached by setting a time-out period that is long enough to guarantee convergence. In an alternative embodiment, the condition of convergence is reached by detecting no significant change in the weighting factor.

The adaptation equation (6) is only an example of adapting the weighting factor W in accordance with a correlation between the control code C and the second digital code X. Other adaptation equations are possible, as long as one seeks to decrease (increase) the weighting factor W when one detects a positive (negative) correlation between the control code C and the second digital code X. Also, any embodiment that seeks to adjust a weighting factor in accordance with a correlation between control code C and the second digital code X falls into a scope of the present invention, as long as the control code C is utilized and involved in perturbing an analog-to-digital conversion within a conversion stage of a pipeline ADC. The present invention principle is based on an observation (shown in equation (4)) that a perturbation to the sub-ADC (due to the control code C) does not alter the result of the second digital code X as long as the weighting factor W is set properly (so that the W is equal to the reciprocal of the inter-stage gain G); when the perturbation due to the control code C leads to a change in the result of the second digital code X (in a statistical sense), the weighting factor W needs to be adjusted in accordance with the correlation between the control code C and the second digital code X.

In an alternative embodiment, digital weighted sum circuit 116 performs the following weighted-sum function:

$$X=W \cdot D+R=W \cdot D+r+n=W \cdot D-W \cdot G \cdot q(C)+n. \quad (7)$$

Combining Equations (1) and (7), one obtains $$X=W \cdot x+(W-G) \cdot q(C)+n. \quad (8)$$

In this embodiment, the weighting factor W is adjusted according to the following equation $$W^{(new)}=W^{(old)}+\mu \cdot X \cdot C. \quad (9)$$

The weighting factor W will converge after the condition W=G is reached, upon which the second digital output X becomes statistically independent of the control code C.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus for receiving a first analog signal, a first digital code, a control code, and generating a second analog signal, and a second digital code, the apparatus comprising:
    a sub-ADC (analog-digital converter) for converting the first analog signal into an intermediate digital code under a perturbation by the control code;
    a sub-DAC (digital-analog converter) for converting the intermediate digital code into an intermediate analog signal;
    an analog summing circuit for subtracting the intermediate analog signal from the first analog signal to generate a residual analog signal;
    an amplifier for amplifying the residual analog signal by an inter-stage gain factor to generate the second analog signal;
    a digital summing circuit for generating the second digital code by performing a weighted sum on the intermediate digital code and the first digital code in accordance with a weighting factor; and
    an adaptation circuit for receiving the second digital code and the control code and generating the weighting factor in accordance with a correlation between the control code and the second digital code.

2. The apparatus of claim 1 further comprising a succeeding analog-to-digital converter for receiving and converting the second analog signal into the first digital code.

3. The apparatus of claim 2, wherein: the control code is a binary sequence that is of either a first control value or a second control value, and is substantially equally likely to be of either value.

4. The apparatus of claim 3, wherein the sub-ADC further comprises a comparator for comparing the first analog signal with a reference level to generate a comparison output of either a first logical value or a second logical value.

5. The apparatus of claim 4, wherein the control code perturbs the comparator so as to make the comparison output more likely to be of the second logical value when the control code is of the first control value and more likely to be of the first logical value when the control code is of the second control value.

6. The apparatus of claim 4, wherein the weighting factor is adjusted only when the second digital code falls into a region where a corresponding analog signal level is near the reference level.

7. The apparatus of claim 3, wherein a value of the intermediate digital code is statistically lower when the control code is of the first control value and statistically higher when the control code is of the second control value.

8. A method of performing analog-to-digital conversion, the method comprising the following steps:
receiving a first analog signal;
receiving a control code;
converting the first analog signal into an intermediate digital code in accordance with the control code;
converting the intermediate digital code into an intermediate analog signal;
generating a residual analog signal by subtracting the intermediate analog signal from the first analog signal;
generating a second analog signal by amplifying the residual analog signal with a gain factor;
converting the second analog signal into a first digital code;
performing a weighted sum on the intermediate digital code and the first digital code in accordance with a weighting factor to generate a second digital code; and
adapting the weighting factor in accordance with a correlation between the second digital code and the control code.

9. The method of claim 8, wherein the control code is a binary sequence of either of first control value or a second control value and is substantially equally likely to be of either value.

10. The method of claim 9, wherein a value of the intermediate digital code is statistically lower when the control code is of the first control value and statistically higher when the control code is of the second control value.

11. The method of claim 10, wherein step of converting the first analog signal into the intermediate digital code further comprises: increasing a reference level of a comparator when the control code is of the first control value and decreasing the reference level of the comparator when the control code is of the second control value.

12. The method of claim 10, wherein step of adapting the weighting factor further comprises: adapting the weighting factor only when the second digital code is near a region where the second digital code is possibly correlated with the control code.

13. An pipeline ADC (analog-to-digital converter) comprising a conversion stage and a subsequent stage, wherein the conversion stage comprises:
a sub-ADC (analog-digital converter) for receiving and converting a first analog signal into an intermediate digital code under a perturbation by a control code;
a sub-DAC (digital-analog converter) for converting the intermediate digital code into an intermediate analog signal;
an analog summing circuit for subtracting the intermediate analog signal from the first analog signal to generate a residual analog signal;
an amplifier for amplifying the residual analog signal by an inter-stage gain factor to generate a second analog signal, wherein the second analog signal is received and converted into a first digital code by the subsequent stage;
a digital summing circuit for generating a second digital code by performing a weighted sum on the intermediate digital code and the first digital code in accordance with a weighting factor; and
an adaptation circuit for receiving the second digital code and the control code and generating the weighting factor in accordance with a correlation between the control code and the second digital code.

14. The apparatus of claim 13, wherein: the control code is a binary sequence that is of either a first control value or a second control value, and substantially equally likely to be of either value.

15. The apparatus of claim 14, wherein the sub-ADC further comprises a comparator for comparing the first analog signal with a reference level to generate a comparison output of either a first logical value or a second logical value.

16. The apparatus of claim 15, wherein the control code perturbs the comparator so as to make the comparison output more likely to be of the second logical value when the control code is of the first control value and more likely to be of the first logical value when the control code is of the second control value.

17. The apparatus of claim 14, wherein the weighting factor is adjusted only when the second digital code falls into a region where a corresponding analog signal level is near a reference level.

18. The apparatus of claim 17, wherein a value of the intermediate digital code is statistically lower when the control code is of the first control value and statistically higher when the control code is of the second control value.

* * * * *